(12) United States Patent
Sun et al.

(10) Patent No.: US 11,223,280 B1
(45) Date of Patent: Jan. 11, 2022

(54) MULTIPHASE VOLTAGE REGULATOR WITH MULTIPLE VOLTAGE SENSING LOCATIONS

(71) Applicant: Cisco Technology, Inc., San Jose, CA (US)

(72) Inventors: Yang Sun, Zhejiang (CN); Zomin Gan, NanJing (CN); Min Wang, NanJing (CN); Yepeng Chen, Shanghai (CN)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/923,648

(22) Filed: Jul. 8, 2020

(51) Int. Cl.
*H02M 3/158* (2006.01)
*G01R 19/00* (2006.01)

(52) U.S. Cl.
CPC ...... *H02M 3/1584* (2013.01); *G01R 19/0038* (2013.01); *H02M 3/1586* (2021.05)

(58) Field of Classification Search
None
See application file for complete search history.

(56) References Cited

U.S. PATENT DOCUMENTS

| | | | |
|---|---|---|---|
| 6,307,802 B1 * | 10/2001 | Manning | G11C 5/147 365/226 |
| 6,947,273 B2 * | 9/2005 | Bassett | G06F 1/26 361/111 |
| 7,135,842 B2 | 11/2006 | Banerjee et al. | |
| 7,839,205 B2 * | 11/2010 | Hirobe | G11C 5/147 327/540 |
| 8,299,847 B2 * | 10/2012 | Matano | G06F 1/189 327/544 |
| 8,841,893 B2 * | 9/2014 | Bulzacchelli | G05F 1/575 323/280 |
| 9,213,382 B2 * | 12/2015 | Paillet | G06F 1/26 |
| 9,645,590 B1 * | 5/2017 | Fung | G05F 1/575 |
| 9,946,278 B2 * | 4/2018 | Rodriguez | G05F 1/56 |
| 9,983,602 B2 | 5/2018 | Raja et al. | |
| 10,069,421 B2 | 9/2018 | Todorov et al. | |
| 10,218,273 B2 * | 2/2019 | Ergin | H02M 3/1584 |
| 10,340,785 B2 | 7/2019 | Berge et al. | |
| 10,425,007 B2 | 9/2019 | Tang et al. | |

(Continued)

OTHER PUBLICATIONS

Carmen Parisi, "Multiphase Buck Design From Start to Finish (Part 1)", Texas Instruments, SLVA882A—Apr. 2017—Revised May 2019, 20 pages.

(Continued)

*Primary Examiner* — Jeffery S Zweizig
(74) *Attorney, Agent, or Firm* — Edell, Shapiro & Finnan, LLC

(57) ABSTRACT

A voltage regulator dynamically adjusts the voltage distribution on a voltage rail based on multiple feedback measurements. The voltage regulator provides electrical power to a voltage rail at multiple power supply locations along the voltage rail. The voltage regulator obtains voltage measurements from multiple voltage sensing locations on the voltage rail and detects a spatially unequal voltage deviation in the voltage rail. The voltage regulator adjusts the electrical power provided to the voltage rail at each of the power supply locations to compensate for the spatially unequal voltage deviation in the voltage rail.

20 Claims, 5 Drawing Sheets

(56) References Cited

U.S. PATENT DOCUMENTS

2004/0124713 A1  7/2004  Orr et al.
2010/0052422 A1  3/2010  Ho et al.

OTHER PUBLICATIONS

Renesas, "Powernagigator 5.4 Digital Multiphase User Guide", Renesas Electronics Corporation, Mar. 2018, 67 pages.
International Search Report and Written Opinion in counterpart International Application No. PCT/US2021/040075, dated Sep. 23, 2021, 13 pages.

* cited by examiner

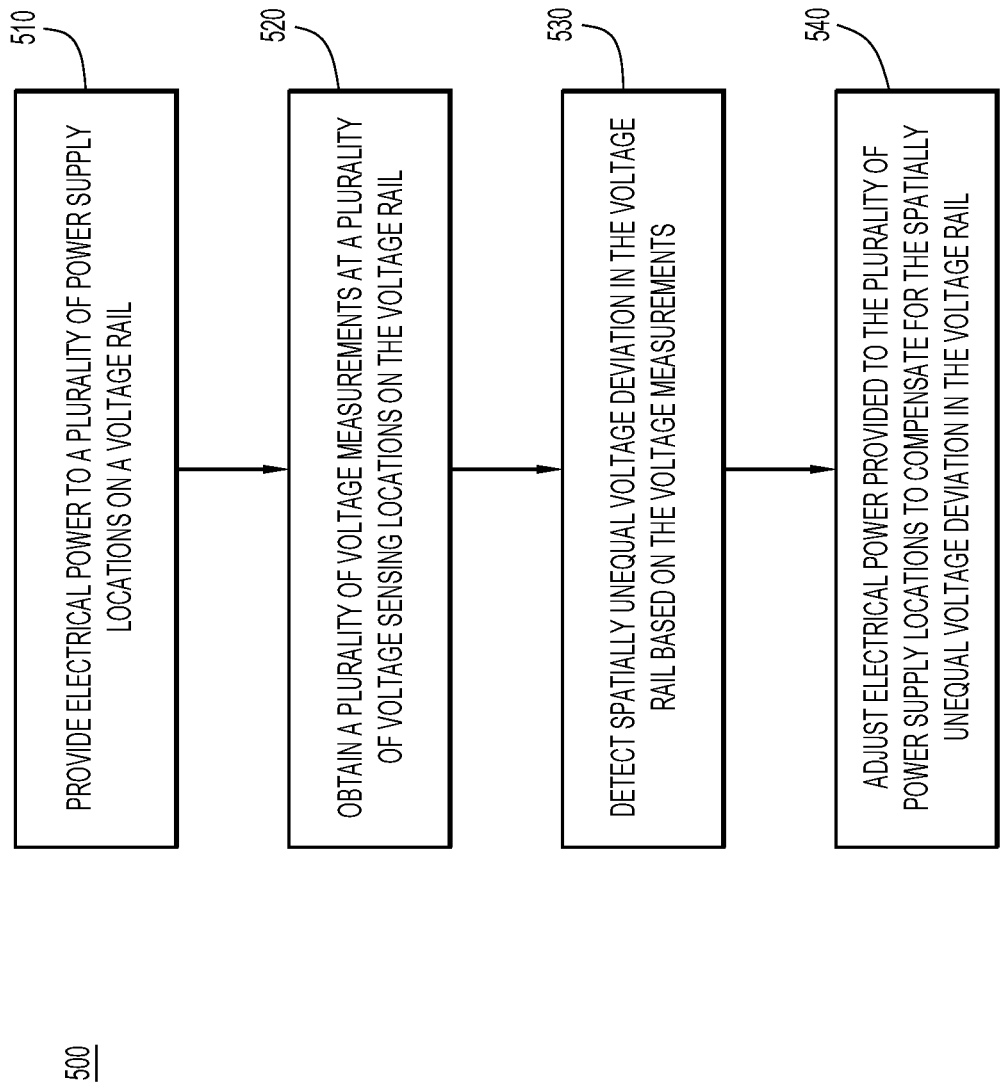

MULTIPHASE VOLTAGE REGULATOR WITH MULTIPLE VOLTAGE SENSING LOCATIONS

TECHNICAL FIELD

The present disclosure relates to voltage regulation systems.

BACKGROUND

Remote voltage sensing is a common and effective feedback mechanism used in modern voltage regulator design. The voltage feedback enables a precise voltage supply with the resistive drop in the current path. A typical voltage regulator uses the remote sensing terminal to sense the voltage at the load point and regulate the output power of the voltage regulator. This enables the voltage regulator to achieve higher output performance to the load.

Multiphase voltage regulator design typically uses multiple Field Effect Transistor (FET) stages, with different phases associated with each FET. A single voltage regulator may control each phase with a Pulse Width Modulation (PWM) controller to enable larger currents, smaller ripple, and a quicker response to supply a power rail in a circuit.

BRIEF DESCRIPTION OF THE DRAWINGS

FIG. 5 is a flowchart illustrating operations for providing power to a voltage rail, according to an example embodiment.

DESCRIPTION OF EXAMPLE EMBODIMENTS

Overview

Figure 1:
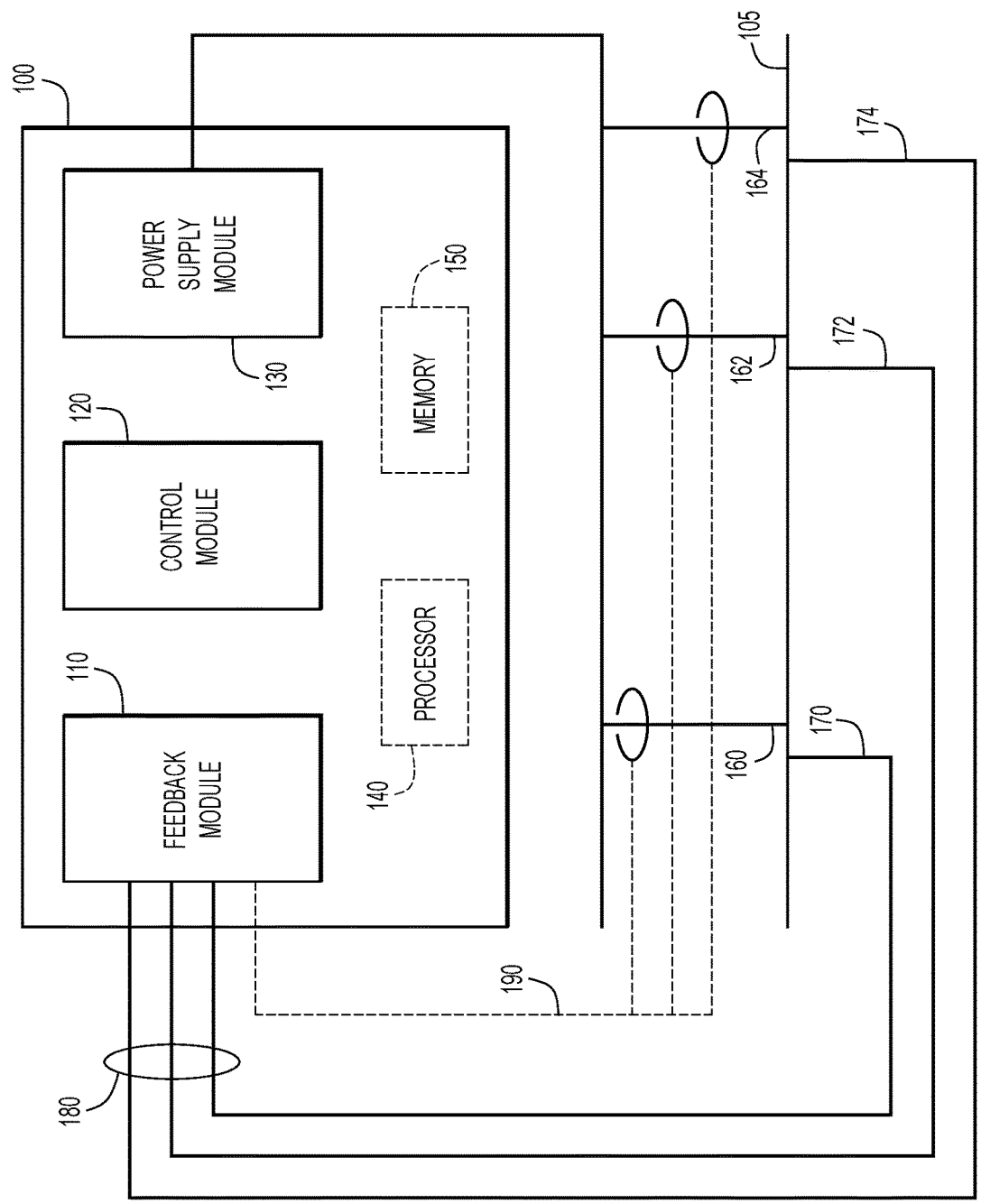
FIG. 1 is a simplified block diagram of a voltage regulation system with multiple voltage sensing points, according to an example embodiment.

In one form, a method for dynamically adjusting the voltage distribution on a voltage rail based on multiple feedback measurements is provided. The method includes providing electrical power to a voltage rail at a plurality of power supply locations along the voltage rail. The method also includes obtaining a plurality of voltage measurements from a corresponding plurality of voltage sensing locations on the voltage rail and detecting a spatially unequal voltage deviation in the voltage rail. The method further includes adjusting the electrical power provided to the voltage rail at each of the plurality of power supply locations to compensate for the spatially unequal voltage deviation in the voltage rail.

Example Embodiments

In a typical multiphase voltage regulation topology, multiple drivers and corresponding Field Effect Transistors (FETs) form phases that are placed in close proximity to one side of the load for the voltage regulator. The placement of the components may enable the voltage regulator Pulse Width Modulation (PWM) controller to provide each phase with an equal current output. Providing a stable voltage source that maintains a static voltage difference in a dynamic, high current situation presents additional challenges without the added expense of more copper and capacitors.

Additionally, typical voltage regulators rely on a single voltage sensing node for each voltage rail. The voltage sensing node may by a single terminal node sensing the high voltage side or a differential node sensing both the ground and the high voltage side. The techniques described herein provide for a multiphase voltage regulator implementing more than one voltage sensing node to gather voltage data from various points on the voltage rail, and using the voltage data to increase the performance of the multiphase voltage regulator with separately controlled phase currents.

According to the techniques described herein, a single voltage regulator receives feedback from multiple voltage sensing nodes on a single voltage rail. In some examples, the voltage sensing input pins may be closely associated with PWM controller chip packages. In one example, the voltage regulator may integrate a PWM controller with drivers and/or Metal-Oxide Semiconductor FETs (MOSFETs). In these examples, multiple sets of voltage sensing traces may be connected to chip packages for one voltage rail.

Each phase of the power supply may have a different duty cycle or output current/voltage level based on the different voltage measurements from the voltage sensing nodes. This enables the voltage regulator to better shape the current path and whole power rail compensation representation. Some phases may be strongly associated with some of the voltage sensing nodes while other phases will be strongly associated with other voltage sensing nodes based on the locations of the phases relative to the location of the voltage sensing nodes.

In one example, a graph theory may be employed to model the voltage distribution of the entire power plane and allow the voltage regulator to adjust the voltage/current of separate phases and shape the voltage distribution of the power plane. For instance, the voltage regulator may actively maintain slightly different voltage levels at different locations on the same voltage rail.

Referring now to FIG. 1, a simplified block diagram illustrates multiphase voltage regulator 100 that provides power to a voltage rail 105. The voltage regulator 100 includes a feedback module 110, a control module 120, and a power supply module 130. The voltage regulator may also include a processor 140, which may process instructions stored in a memory 150. The processor 140 may include one or more processing elements (e.g., hardware microprocessors) configured to perform one or more of the functions of the feedback module 110, the control module 120, and/or the power supply module 130. The memory 150 may be one or more computer readable storage media, such as Random Access Memory (RAM), cache memory, a magnetic disk drive, a solid state hard drive, a semiconductor storage device, Read-Only Memory (ROM), Erasable Programmable Read-Only Memory (EPROM), flash memory, or any other computer readable storage media that is capable of storing program instructions or digital information. Instructions for at least some of the functionality of the feedback module 110, control module 120, and/or the power supply module 130 may be stored in the memory 150 for execution by the processor 140. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

The power supply module 130 is configured to provide power to three power supply points 160, 162, and 164, which may be positioned at different places along the voltage rail 105. Three voltage sensing nodes 170, 172, and 174 detect the voltage at three different places along the voltage rail 105 and provide the feedback 180 to the feedback module 110 in the voltage regulator 100. The current supplied to each power supply point 160, 162, and 164 may also be measured and reported back to the feedback module 110 as feedback 190.

In one example, the voltage sensing nodes 170, 172, and 174 may be located physically proximate the positions of the power supply points 160, 162, and 164 along the voltage rail. In another example, the power supply points 160, 162, 164 may comprise multiple phases of PWM signals. For instance, each power supply point 160, 162, 164 may be assigned a different phase of a PWM signal such that each power supply point 160, 162, 164 is actively providing power to the voltage rail at different times within the PWM cycle. Alternatively, some or all of the phases of the PWM signal may be grouped together at each of the power supply points 160, 162, 164. Each group of phases may be associated with one of the voltage sensing nodes 170, 172, 174.

Each voltage sensing node 170, 172, 174 senses a region of the voltage rail 105 and provides the voltage feedback 180 to the voltage regulator 100. The voltage regulator 100 regulates the current/voltage based on the data received from the voltage sensing nodes 170, 172, 174. The control module 120 may cause the power supply module 130 to separately adjust the output current, output voltage, and/or duty cycle for each power supply point 160, 162, and 164. For instance, one or more of the power supply points 160, 162, or 164 may be placed adjacent to loads (e.g., processor chip, memory module, etc.) that draws different amounts of current, either statically or dynamically. Placement of the power supply points 160, 162, 164 and monitoring the voltage sensing nodes 170, 172, 174 enables the control module 120 adjust the current/voltage based on the actual power draw of nearby load devices.

Figure 2:
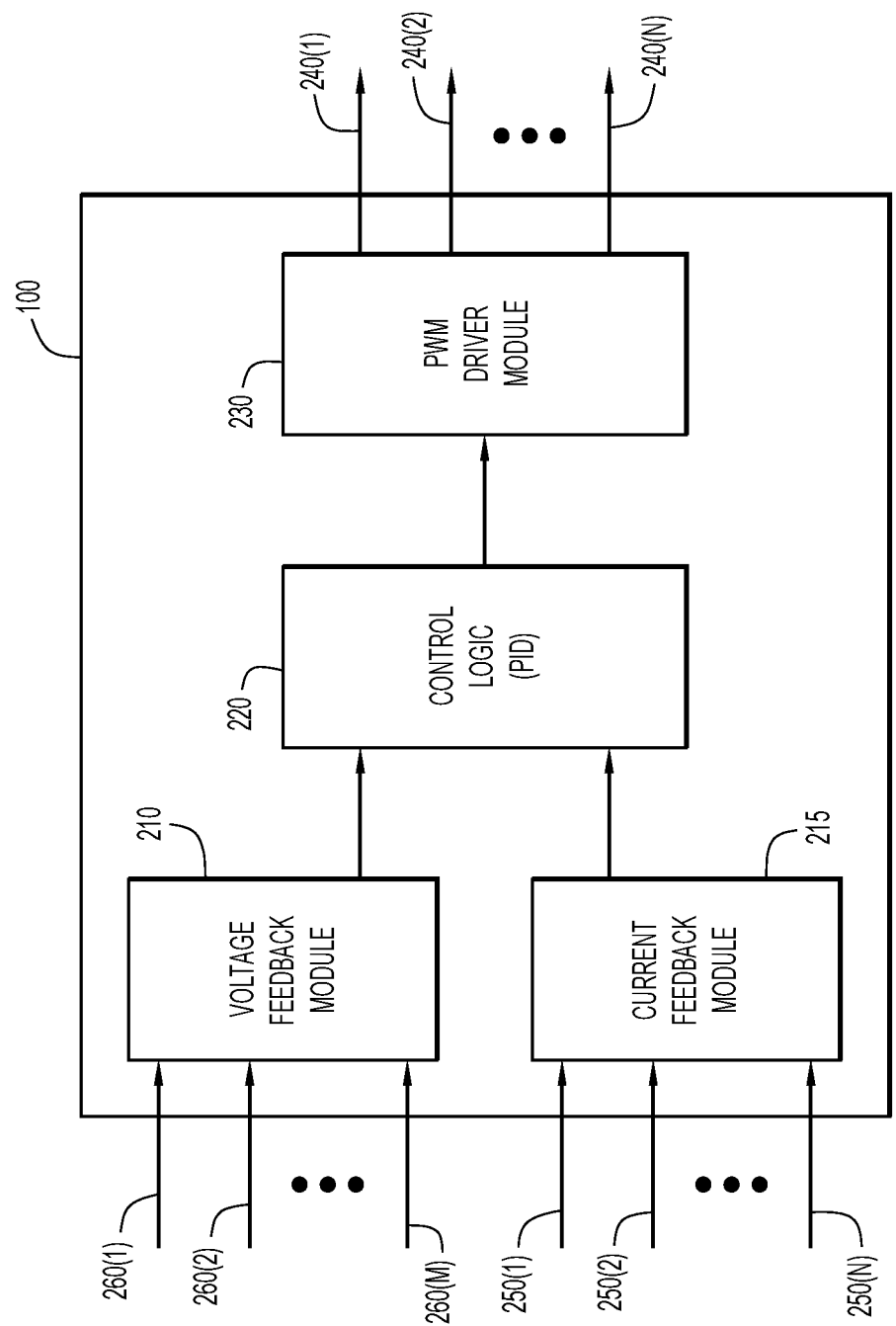
FIG. 2 is a simplified block diagram of a multiphase voltage regulator with feedback from multiple voltage sensing points, according to an example embodiment.

Referring now to FIG. 2, one example of a multiphase voltage regulator 100 is shown. The multiphase voltage regulator 100 includes a voltage feedback module 210, a current feedback module 215, control logic 220, and PWM driver module 230. In one example, the control logic 220 includes a Proportional/Integral/Derivative (PID) control logic that is tuned to maintain a nominal voltage on the voltage rail.

The PWM driver module 230 generates a plurality of PWM signals 240(1), 240(2), ..., 240(N), which provide electrical power to a voltage rail. In one example, the PWM signals 240(1), 240(2), ..., 240(N) are generated with a different phase, e.g., to smooth out the power profile being sent to the voltage rail. Typically, the combination of the PWM signals 240(1), 240(2), ..., 240(N) provides a constant, steady voltage level at the voltage rail.

The current in each phase of the PWM signals 240(1), 240(2), ..., 240(N) is measured and provided to the current feedback module 215 as current feedback 250(1), 250(2), ..., 250(N). Additionally, the voltage at a number of different points along the voltage rail is measured and returned to the voltage feedback module 210 as voltage feedback 260(1), 260(2), ..., 260(M). In one example, each voltage feedback 260(1), 260(2), ..., 260(M) may be a single ended measurement, a differential measurement, or other type of measurement.

Figure 3:
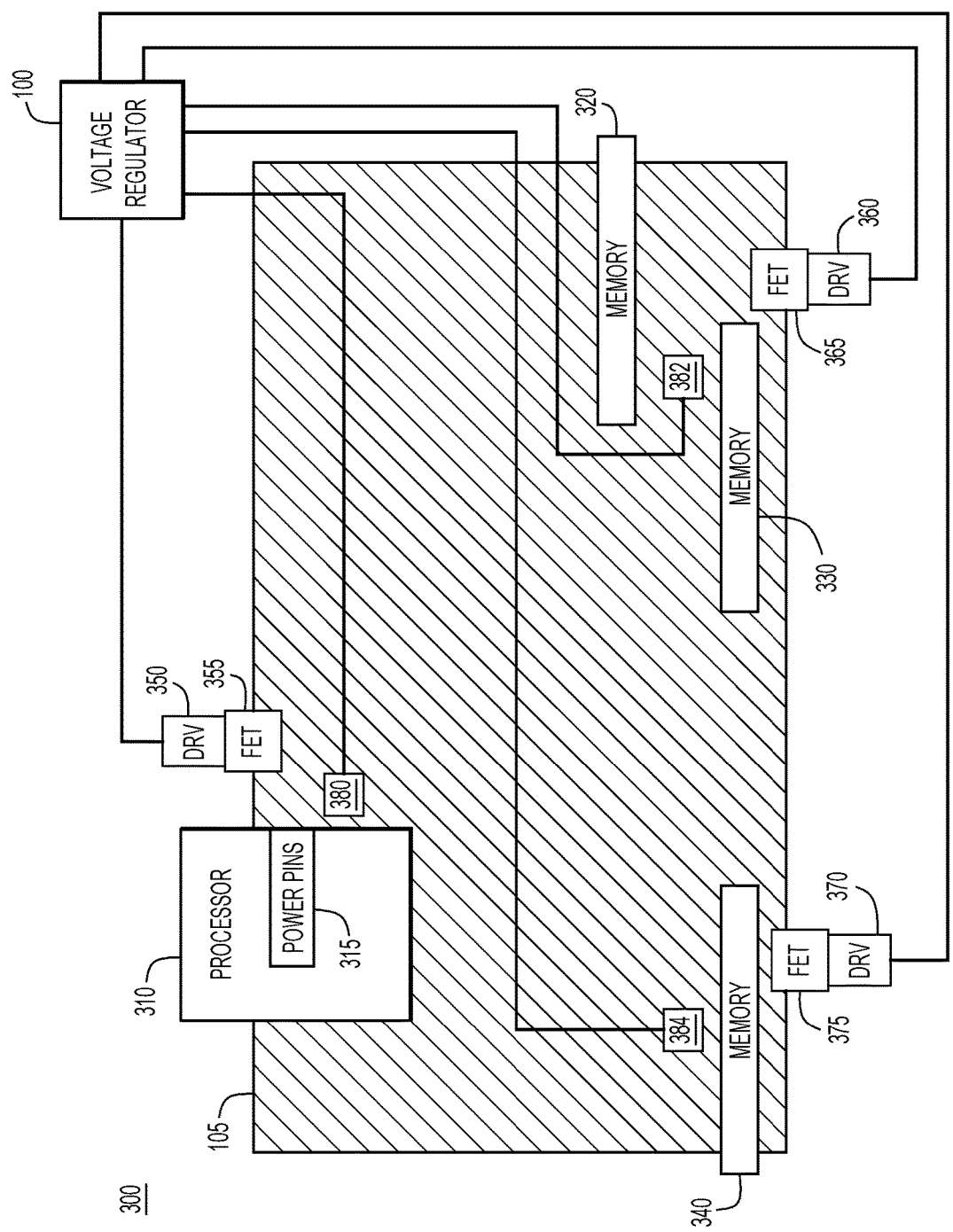
FIG. 3 is a simplified block diagram of voltage regulation system for a power plane with different load devices, according to an example embodiment.

Referring now to FIG. 3, an example implementation of a voltage regulation system 300 is shown with voltage regulator 100 providing power to a voltage rail 105. In the system 300 the voltage rail 105 is a power plane that provides power to a processor chip 310 via power pins 315. The voltage rail 105 also provides power to memory modules 320, 330, and 340. In one example, the memory modules 320, 330, and 340 may be includes one or more memory chips. For instance, each memory module 320, 330, and 340 may comprise a pair of Double Data Rate 4 (DDR4) Registered Dual In-line Memory Modules (RDIMMs).

The voltage regulator 100 provides a first phase of electrical power via a driver 350 and a power FET 355 positioned near the processor 310. The voltage regulator 100 provides a second phase of power via a driver 360 and a power FET 365 positioned near the memory modules 320 and 330. The voltage regulator 100 provides a third phase of power via a driver 370 and a power FET 375 positioned near the memory module 340. To monitor the voltage level in the voltage rail 105, voltage sensing nodes 380, 382, and 384 are positioned along the voltage rail 105. The voltage sensing node 380 is positioned near the power FET 355 and the processor 310. The voltage sensing node 382 is positioned near the power FET 365 and the memory modules 320 and 330. The voltage sensing node 384 is positioned near the power FET 375 and the memory module 340.

In the voltage regulation system 300, the voltage regulator 100 controls three phases of PWM signals. Each voltage sensing node (also referred to as a voltage sensing point) 380, 382, and 384 is placed near one load point to provide precise voltage sensing of the nearby load. The voltage regulator 100 strongly associates each particular phase of the PWM signal with the voltage sensing point that is closest to the particular phase, and weakly associates the particular phase of the PWM signal with the other voltage sensing points, which are further from the particular phase. Specifically, the voltage regulator 100 strongly associates the voltage sensing point 380 with the signal provided to the driver 350, and weakly associates the voltage sensing point 380 with the signal provided to the drivers 360 and 370. Similarly, the voltage regulator 100 strongly associates the voltage sensing point 382 with the signal provided to the driver 360, and weakly associates the voltage sensing point 382 with the signal provided to the drivers 350 and 370. Further, the voltage regulator 100 strongly associates the voltage sensing point 384 with the signal provided to the driver 370, and weakly associates the voltage sensing point 384 with the signal provided to the drivers 350 and 360.

The three phases are spread along the power plane rather than placed at a single point, ensuring that each phase has a different current path to each load. With the voltage measurement from the different voltage sensing points 380, 382, and 384, the voltage regulator 100 may separately regulate the duty cycle and/or output current/voltage for each phase to provide voltage compensation at specific locations. Additionally, adjusting the duty cycle and/or output voltage/current to compensate for a voltage deviation in one location of the power plane may have minimal impact on the voltage of other locations of the power plane.

In one example, the processor 310 may draw significantly more current than the memory modules 320, 330, and 340. The voltage sensing node 380 near the processor 310 would detect a lower voltage than the voltage sensing nodes 382 and 384. The voltage regulator 100 detects the lower voltage, i.e., a higher voltage deviation, at the voltage sensing point 380 and increases the current output of the phase near the voltage sensing point 380, i.e., the first phase with the driver 350 and power FET 355, up to a predetermined current limit of the phase. The voltage regulator 100 may also increase the current in the other two phases in proportion to the current increase of the first phase until the first phase reaches the phase current limit.

In some cases, the voltage drop at the voltage sensing point 380 may be large enough that the first phase reaches the phase current limit without compensating for the voltage drop. If the components of the first phase approach a current limit for the phase, the voltage regulator may begin to increase the current of the other two phases.

At other times, the memory modules 320, 330, and/or 340 may draw significantly more current than the processor 310, and the voltage at the voltage sensing points 382 and/or 384 may be lower than the voltage at the voltage sensing point 380. The voltage regulator 100 detects the voltage deviation and enables more current to the second phase and/or third phase near the voltage sensing points 382 and/or 384. In this way, the voltage deviation at the voltage sensing point 382 and/or 384 is correctly compensated with less impact on the processor 310.

In another embodiment, large scale chips (e.g., microprocessors) may draw significant amounts of current from power pins placed in different locations of the voltage. Due to the inherent resistance in the voltage rail, the voltage provided to power pins close to power supply drivers may vary significantly from the voltage provided to power pins far from the power supply drivers.

The voltage regulator faces challenges in providing a voltage value within a specified range to any portion of a large scale chip, particularly as chips draw an increasing amount of current from the voltage rail. If the voltage rail provides a voltage level that is too low for one of the power pins in a large scale chip, then the chip may not be able to correctly distinguish between logic 0 and logic 1 values. Conversely, if the voltage rail provides a voltage level that is too high, then the chip may suffer from thermal issues. A narrower specified range for the voltage of the voltage rail allows for increased thermal efficiency and less design complexity of the chip.

Figure 4:
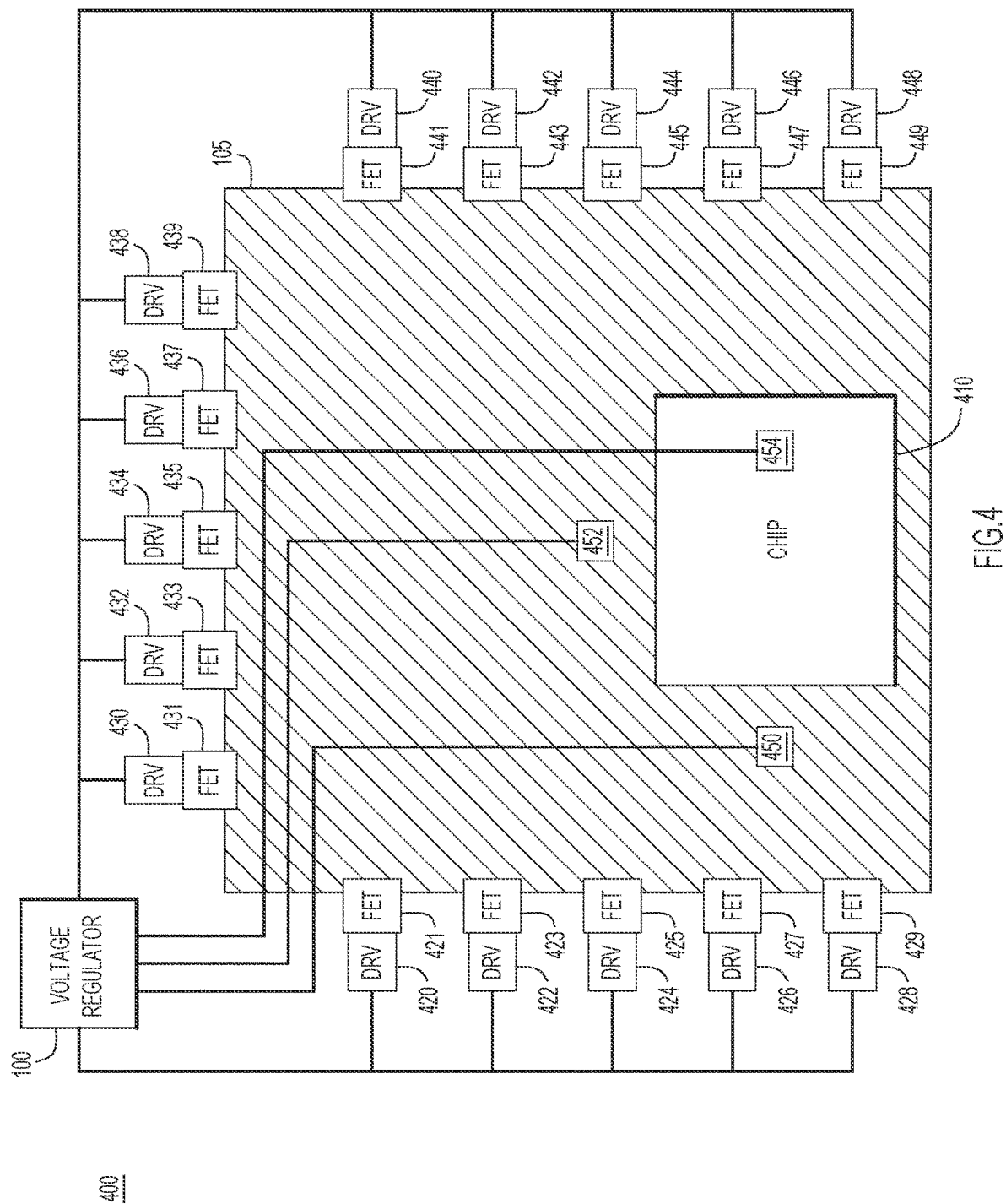
FIG. 4 is a simplified block diagram of a voltage regulation system for a power plane providing power to a large area chip, according to an example embodiment.

Referring now to FIG. 4, a voltage regulation system 400 is shown to provide consistent voltage to multiple points in a large scale, high power chip 410 via a voltage rail 105. The voltage regulator 100 provides electrical power in five phases to each of three banks of power supply drivers surrounding the chip 410. In the left bank, the voltage regulator 100 provides one phase of the PWM power signal to a driver 420 coupled to a power FET 421. Additionally, the voltage regulator 100 provides additional phases of the PWM power signal on the left bank of power supply drivers to drivers 422, 424, 426, and 428 coupled to power FETs 423, 425, 427, and 429, respectively.

Similarly, in the top bank, the voltage regulator 100 provides one phase of the PWM power signal to a driver 430 coupled to a power FET 431. Additionally, the voltage regulator 100 provides additional phases of the PWM power signal on the top bank of power supply drivers to drivers 432, 434, 436, and 438 coupled to power FETs 433, 435, 437, and 439, respectively. Further, in the right bank, the voltage regulator 100 provides one phase of the PWM power signal to a driver 440 coupled to a power FET 441. Additionally, the voltage regulator 100 provides additional phases of the PWM power signal on the right bank of the power supply drivers to drivers 442, 444, 446, and 448 coupled to power FETs 443, 445, 447, and 449, respectively. The voltage regulator 100 measures the voltage level at voltage sensing points 450, 452, and 454, which correspond to the left, top, and right sides of the chip, respectively.

The voltage regulator 100 strongly correlates the signals for the left bank (i.e., drivers 420, 422, 424, 426, and 428) with the voltage measured at the voltage sensing point 450. Similarly, the voltage regulator strongly correlates the signals for the top bank (i.e., drivers 430, 432, 434, 436, and 438) with the voltage measured at the voltage sensing point 452. Likewise, the voltage regulator 100 strongly correlates the signals for the right bank (i.e., drivers 440, 442, 444, 446, and 448) with the voltage measured at the voltage sensing point 454. The voltage regulator 100 may continuously monitor the voltage values measured at the voltage sensing points 450, 452, and 454. The voltage regulator may adjust the PWM signals to the drivers based on a comparison between the voltage values measured at the voltage sensing points 450, 452, and 454 and a target value for the voltage rail, as well as based on the difference between the measured voltages values.

In one example, with the chip 410 drawing a large static current load, the voltage regulator 100 may adjust each bank of power supply drivers to move all three voltage sensing points 450, 452, and 454 to a target voltage value. The current provided by each bank of power supply drivers may differ depending on where in the chip 410 the power pins are drawing current. If the voltage sensing point 450 measures a lower voltage than the voltage sensing points 452 and 454, then the voltage regulator 100 may adjust the left bank (e.g., one or more of drivers 420, 424, 426, and 428) to provide more current than the top bank or the right bank. In other words, each bank of power supply drivers may provide a different amount of current due to different locations and different current path loss to the power pins of the chip 410.

In another example, with the chip 410 drawing a dynamic load, some of the power pins of the chip 410 may draw different amount of current at different times. When certain power pins of the chip 410 draw more current, the voltage of the voltage rail 105 drops in the vicinity of the power pins. The voltage sensing points 450, 452, and 454 detect the voltage drop and the voltage regulator 100 enables the phases of the bank nearest the voltage sensing point with the lowest voltage to increase its current output. The voltage regulator 100 may also reduce the amount of current provided by the banks of power supply drivers furthest from the power pin drawing the most current from the voltage rail 105. Providing more current from the bank of power supply drivers closest to the power pin drawing the most current at any particular time may reduce the size of the capacitors needed in the total power design.

In a further example, the voltage/current supplied by each phase may be correlated with the voltage sensing nodes in a matrix. A graph theory may be used to determine the duty cycle and/or current/voltage output by each phase. In other words, the voltage sensing points may determine a voltage distribution in the voltage rail 105, and the voltage regulator 100 may drive individual phases to shape the voltage distribution throughout the voltage rail 105 to compensate for any voltage deviation detected by the voltage sensing nodes.

In one example, the voltage regulator 100 may shape the voltage distribution to be a constant voltage level throughout the entire voltage rail 105. Alternatively, the voltage regulator may shape the voltage distribution to be uneven, e.g., based on expected current draws from different power pins. The voltage regulator 100 may determine the optimal voltage distribution for the voltage rail based on the distribution of load devices drawing power from the voltage rail, the expected use conditions, and/or the measured feedback voltages.

Different current provided to different phases may cause uneven thermal effects, for which the voltage regulator 100 may compensate. As long as the voltage regulator 100 monitors the current to each phase and the thermal conditions of each phase, the voltage regulator 100 may maintain an optimal balance between current and thermal considerations.

In some examples, the voltage regulator 100 may integrate multiple components, including a PWM controller (e.g., PWM driver module 230 as shown in FIG. 2), FET drivers (e.g., drivers 350, 360, and 370 in FIG. 3), power FETs (e.g., FET 355, 365, and FET 375 in FIG. 3), or other active or passive components (e.g., capacitors, inductors, etc.). In other examples, only the FET drivers and FETs are integrated. In still other examples, the PWM controller may be integrated with the FET drivers.

Referring now to FIG. 5, a flowchart is shown that depicts operations of a voltage regulator (e.g., voltage regulator 100) in an example process 500 to provide a stable voltage rail. At 510, the voltage regulator provides electrical power to a plurality of power supply locations on a voltage rail. In one example, the voltage regulator is a multiphase voltage regulator that provides PWM signals to multiple power supply drivers. Each power supply driver may include a separate phase of PWM signal to enable different power supply drivers to be active at different times.

At 520, the voltage regulator obtains a plurality of voltage measurements from a plurality of different voltage sensing locations in the voltage rail. In one example, the voltage sensing locations may be close to the locations of one or more power supply locations. In another example, the voltage sensing locations may be close to the locations of one or more load devices that are powered from the voltage rail. Based on the plurality of voltage measurements, the voltage regulator detects a spatially unequal voltage deviation in the voltage rail at 530. In one example, one of the load devices may draw a significant amount of current, lowering the voltage in the vicinity of the load device relative to the voltage in the remainder of the voltage rail.

At 540, the voltage regulator adjusts the electrical power provided to the plurality of power supply locations to compensate for the spatially unequal voltage deviation in the voltage rail. In one example, the voltage regulator may adjust the phase of a power supply locations closest to the voltage deviation to minimize the voltage deviation and maintain a predetermined value of the voltage rail.

In summary, the techniques presented herein provide for a voltage regulator that receives feedback from multiple voltage sensing locations (multiple remote voltage sense nodes) to improve performance under high current load for a single power rail voltage regulator. The voltage regulator enables distributed FET phase allocation to improve voltage regulator efficiency and performance. In particular, the techniques presented herein enable the voltage regulator to actively adjust each power phase current for optimal power efficiency and performance. Multiple voltage sensing points provide a more accurate detection of the voltage distribution throughout the entire power plane.

In one embodiment, the techniques presented herein enable actively adjusting each different current path from multiple FET phases to a single power rail to optimize power efficiency and performance. Each FET phase current may be strongly or weakly correlated with different voltage sensing nodes based on the locations of the FET phase relative to the location of the voltage sensing node.

Additionally, the techniques presented herein reduce cost by minimizing copper and/or capacitance requirements. Further, the techniques presented herein enable a tighter tolerance for voltage rails, which may allow for chips that operate at a lower voltage to conserve power. In another embodiment, the voltage regulator presented herein may actively maintain slightly different voltage levels at different locations on the same power rail to allow for different design margins in chip design. When phases are spread along the voltage rail, multiple voltage sensing nodes may enable the voltage regulator to provide the phases with an optimal amount of current near each load on the voltage rail, minimizing resistive losses, especially at high current levels.

In one form, a method for dynamically adjusting the voltage distribution on a voltage rail based on multiple feedback measurements is provided. The method includes providing electrical power to a voltage rail at a plurality of power supply locations along the voltage rail. The method also includes obtaining a plurality of voltage measurements from a corresponding plurality of voltage sensing locations on the voltage rail and detecting a spatially unequal voltage deviation in the voltage rail. The method further includes adjusting the electrical power provided to the voltage rail at each of the plurality of power supply locations to compensate for the spatially unequal voltage deviation in the voltage rail.

In a specific embodiment, adjusting the electrical power provided to the voltage rail comprises minimizing the spatially unequal voltage deviation in the voltage rail.

In another specific embodiment, the method also includes associating each of the plurality of voltage sensing locations with one or more load devices configured to draw power from the voltage rail. Additionally, adjusting the electrical power provided to the voltage rail may comprise determining an optimal voltage distribution along the voltage rail based on a distribution of the one or more load devices and providing differing amounts of electrical power to the plurality of power supply locations on the voltage rail.

In a further specific embodiment, providing electrical power to the voltage rail comprises driving a plurality of PWM signals with different phases. Additionally, the method may also include associating at least one phase of the plurality of PWM signals with each of the plurality of power supply locations. Further, adjusting the electrical power provided to the voltage rail may comprise adjusting one or more of a duty cycle, an output current, or an output voltage for at least one phase of the plurality of PWM signals.

In another form, an apparatus comprising a voltage sensing module, a control module, and a power supply module is provided. The voltage sensing module is configured to obtain a plurality of voltage measurements from a corresponding plurality of voltage sensing locations on a voltage rail. The control module is configured to detect a spatially unequal voltage deviation in the voltage rail based on the plurality of voltage measurements. The power supply module is configured to provide electrical power to the voltage rail at a plurality of power supply locations along the voltage rail. The power supply module is also configured to adjust the electrical power provided to the voltage rail at each of the plurality of power supply locations to compensate for the spatially unequal voltage deviation in the voltage rail.

In another form, a system comprising a voltage rail and a multiphase voltage regulator is provided. The voltage rail is electrically connected to one or more load devices. The multiphase voltage regulator is configured to provide electrical power to the voltage rail at a plurality of power supply locations along the voltage rail. The multiphase voltage regulator is also configured to obtain a plurality of voltage measurements from a corresponding plurality of voltage sensing locations on the voltage rail and detect a spatially unequal voltage deviation in the voltage rail. The multiphase voltage regulator is further configured to adjust the electrical power provided to the voltage rail at each of the plurality of power supply locations to compensate for the spatially unequal voltage deviation in the voltage rail.

Computer readable program instructions for carrying out operations of the present embodiments may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Python, C++, or the like, and procedural programming languages, such as the "C" programming language, Python or similar programming languages. In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the presented embodiments.

Aspects of the present embodiments are described herein with reference to flowchart illustrations and/or block diagrams of methods, apparatus (systems), and computer program products according to presented embodiments. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various presented embodiments. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   driving a plurality of Pulse Width Modulation (PWM) signals with different phases to provide electrical power to a voltage rail at a plurality of power supply locations along the voltage rail;
   obtaining a plurality of voltage measurements from a corresponding plurality of voltage sensing locations on the voltage rail;
   detecting a spatially unequal voltage deviation in the voltage rail based on the plurality of voltage measurements; and
   adjusting the electrical power provided to at least one of the plurality of power supply locations of the voltage rail by adjusting at least one of the plurality of PWM signals to compensate for the spatially unequal voltage deviation in the voltage rail.

2. The method of claim 1, wherein adjusting the electrical power comprises minimizing the spatially unequal voltage deviation in the voltage rail.

3. The method of claim 1, further comprising associating each of the plurality of voltage sensing locations with one or more load devices configured to draw power from the voltage rail.

4. The method of claim 3, wherein adjusting the electrical power comprises:
   determining an optimal voltage distribution along the voltage rail based on a distribution of the one or more load devices; and
   providing differing amounts of electrical power to the plurality of power supply locations on the voltage rail.

5. The method of claim 1, further comprising associating at least one phase of the plurality of PWM signals with each of the plurality of power supply locations.

6. The method of claim 5, wherein adjusting the electrical power comprises adjusting one or more of a duty cycle, an output current, or an output voltage for at least one phase of the plurality of PWM signals.

7. The method of claim 4, wherein the optimal voltage distribution along the voltage rail is uneven.

8. An apparatus comprising:
- a voltage sensing module configured to obtain a plurality of voltage measurements from a corresponding plurality of voltage sensing locations on a voltage rail;
- a control module configured to detect a spatially unequal voltage deviation in the voltage rail based on the plurality of voltage measurements; and
- a power supply module configured to:
  - drive a plurality of Pulse Width Modulation (PWM) signals with different phases to provide electrical power to the voltage rail at a plurality of power supply locations along the voltage rail; and
  - adjust the electrical power provided to at least one of the plurality of power supply locations of the voltage rail by adjusting at least one of the plurality of PWM signals to compensate for the spatially unequal voltage deviation in the voltage rail.

9. The apparatus of claim 8, wherein the control module is configured to cause the power supply module to adjust the electrical power by minimizing the spatially unequal voltage deviation in the voltage rail.

10. The apparatus of claim 8, wherein the control module is further configured to associate each of the plurality of voltage sensing locations with one or more load devices configured to draw power from the voltage rail.

11. The apparatus of claim 10, wherein the control module is configured to:
- determine an optimal voltage distribution along the voltage rail based on a distribution of the one or more load devices; and
- cause the power supply module to provide differing amounts of electrical power to the plurality of power supply locations on the voltage rail.

12. The apparatus of claim 8, wherein the control module is further configured to associate at least one phase of the plurality of PWM signals with each of the plurality of power supply locations.

13. The apparatus of claim 12, wherein the power supply module is configured to adjust the electrical power by adjusting one or more of a duty cycle, an output current, or an output voltage for at least one phase of the plurality of PWM signals.

14. The apparatus of claim 11, wherein the optimal voltage distribution along the voltage rail is uneven.

15. A system comprising:
- a voltage rail configured to be electrically connected to one or more load devices; and
- a multiphase voltage regulator configured to:
  - drive a plurality of Pulse Width Modulation (PWM) signals with different phases to provide electrical power to the voltage rail at a plurality of power supply locations along the voltage rail;
  - obtain a plurality of voltage measurements from a corresponding plurality of voltage sensing locations on the voltage rail;
  - detect a spatially unequal voltage deviation in the voltage rail based on the plurality of voltage measurements; and
  - adjust the electrical power provided to at least one of the plurality of power supply locations of the voltage rail by adjusting at least one of the plurality of PWM signals to compensate for the spatially unequal voltage deviation in the voltage rail.

16. The system of claim 15, wherein the multiphase voltage regulator is configured to adjust the electrical power by minimizing the spatially unequal voltage deviation in the voltage rail.

17. The system of claim 15, wherein the multiphase voltage regulator is further configured to associate each of the plurality of voltage sensing locations with at least one of the one or more load devices.

18. The system of claim 17, wherein the multiphase voltage regulator is configured to adjust the electrical power by:
- determining an optimal voltage distribution along the voltage rail based on a distribution of the one or more load devices; and
- providing differing amounts of electrical power to the plurality of power supply locations on the voltage rail.

19. The system of claim 15, wherein the multiphase voltage regulator is further configured to associate at least one phase of the plurality of PWM signals with each of the plurality of power supply locations.

20. The system of claim 18, wherein the optimal voltage distribution along the voltage rail is uneven.

* * * * *